United States Patent
Hamman et al.

(10) Patent No.: US 8,458,535 B2
(45) Date of Patent: Jun. 4, 2013

(54) PACKET INTERLEAVING METHOD

(75) Inventors: Emmanuel Hamman, Marcoussis (FR); Xenofon Doukopoulos, Montrouge (FR)

(73) Assignee: Parrot, Paris (FR)

( * ) Notice: Subject to any disclaimer, the term of this patent is extended or adjusted under 35 U.S.C. 154(b) by 463 days.

(21) Appl. No.: 12/602,907

(22) PCT Filed: Jun. 4, 2008

(86) PCT No.: PCT/EP2008/056943
§ 371 (c)(1), (2), (4) Date: Jun. 2, 2010

(87) PCT Pub. No.: WO2008/148821
PCT Pub. Date: Dec. 11, 2008

(65) Prior Publication Data
US 2010/0293429 A1 Nov. 18, 2010

(30) Foreign Application Priority Data
Jun. 4, 2007 (EP) ...................................... 07290690

(51) Int. Cl.
*G06F 11/00* (2006.01)
(52) U.S. Cl.
USPC ............................ 714/701; 714/798; 714/799
(58) Field of Classification Search
USPC .......................................... 714/701, 751, 752
See application file for complete search history.

(56) References Cited

U.S. PATENT DOCUMENTS
7,573,946 B2 * 8/2009 Sandhu ......................... 375/267
2008/0065963 A1 * 3/2008 Ko et al. ....................... 714/776

FOREIGN PATENT DOCUMENTS
WO   2005/067192   7/2005

OTHER PUBLICATIONS
International Search Report dated Aug. 25, 2008, from corresponding PCT application.

* cited by examiner

*Primary Examiner* — Scott Baderman
*Assistant Examiner* — Sarai Butler
(74) *Attorney, Agent, or Firm* — Young & Thompson

(57) ABSTRACT

The packet interleaving method includes selecting successive input sets of consecutive input packets ($X_1 \ldots X_{Nin}$) received from a forward correction module (14), each input packet ($X_j$) being a vector of constellation points of a predetermined constellation diagram. For each input set, it further includes generating an output set of output packets ($O_1 \ldots O_{Nout}$), each output packet ($O_m$) being a vector of constellation points, by distributing the constellation points of each input packet ($X_j$) of the input set, and sending the output packets ($O_1 \ldots O_{Nout}$) of the output set to a modulator (18). The input set including $N_{in}$ input packets ($X_1 \ldots X_{Nin}$) and each of the $N_{in}$ input packets ($X_1 \ldots X_{Nin}$) including a same number $L_{in}$ of constellation points, the number $N_{out}$ of output packets in the output set is related to $L_{in}$ by the relation $L_{in}=A\times N_{out}$, where A is a fixed whole number.

11 Claims, 3 Drawing Sheets

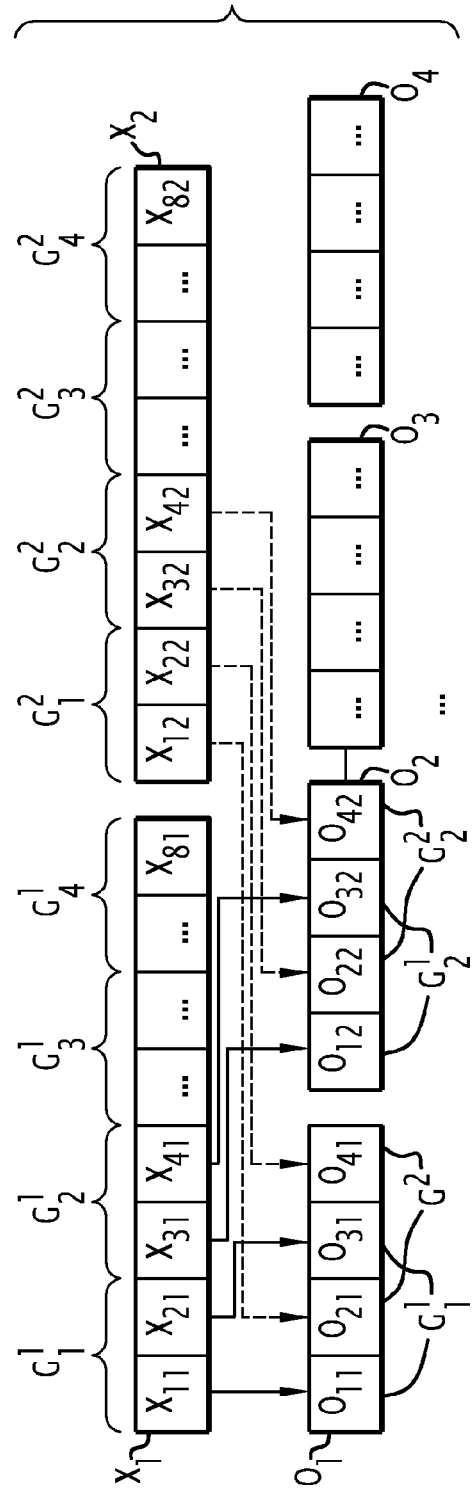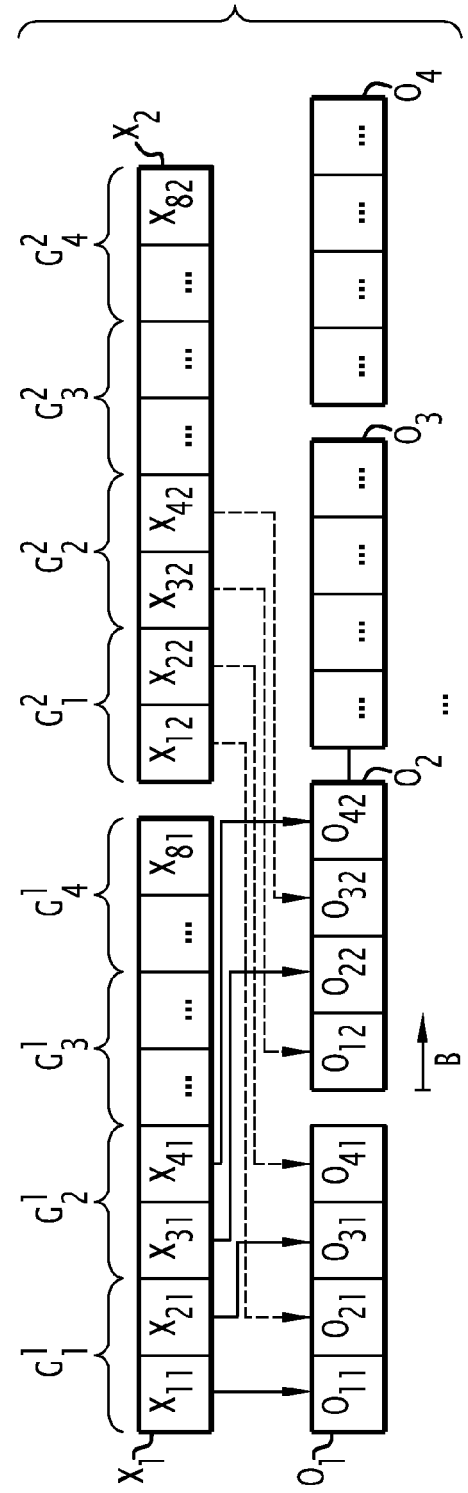

PACKET INTERLEAVING METHOD

The present invention relates to a packet interleaving method, intended to be used in a wireless emitting device.

It is known to interleave packets by:
- selecting successive input sets of consecutive input packets received from a forward correction module, each input packet being a vector of constellation points of a predetermined constellation diagram, and
- for each input set, generating an output set of output packets, each output packet being a vector of constellation points, from the input packets.

The output packets are sent to a modulator that generates symbols emitted by an antenna. Each constellation point of the output packet is thus emitted by the antenna in a symbol.

Several functions are known in the art, for performing the interleaving operation. However, they all have the same drawback of being dedicated to a predetermined set of modulation parameters (e.g. number of pilot carriers, guard interval, etc.). When the modulation parameters of the modulator are changed, these functions are not able to correctly interleave the constellation points of the input packets between the output packets.

It is an object of the invention to provide a packet interleaving method that is able properly interleave the input packets, even when the modulation parameters of the modulator are changed.

Accordingly, the invention relates to a packet interleaving method comprising:
- selecting successive input sets of consecutive input packets received from a forward correction module, each input packet being a vector of constellation points of a predetermined constellation diagram, the packet interleaving method being characterized by, for each input set:
- generating an output set of output packets, each output packet being a vector of constellation points, by distributing the constellation points of each input packet of the input set between the output packets of the output set,
- sending the output packets of the output set to a modulator configured for generating, from the output packets, a waveform, destined to be provided to an antenna,
- the input set comprising $N_{in}$ input packets and each of the $N_{in}$ input packets comprising a same number $L_{in}$ of constellation points, the number $N_{out}$ of output packets in the output set is related to $L_{in}$ by the relation $L_{in} = A \times N_{out}$, where A is a fixed whole number.

Other features of the invention are introduced in the dependent claims.

The invention further relates to a computer program product according to claim 10.

The invention further relates to a packet interleaver according to claim 11.

Figure 1:
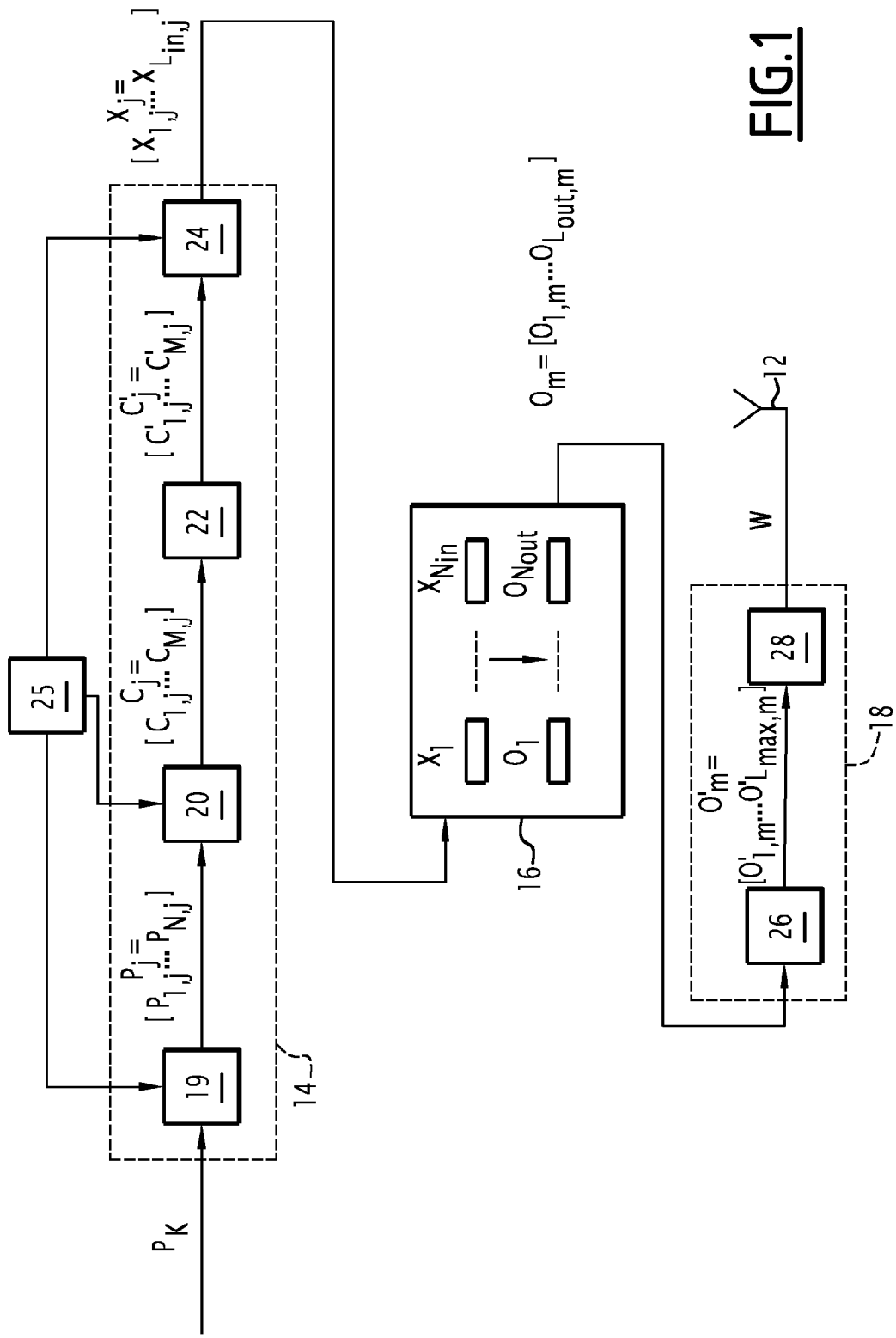
Figure 4:
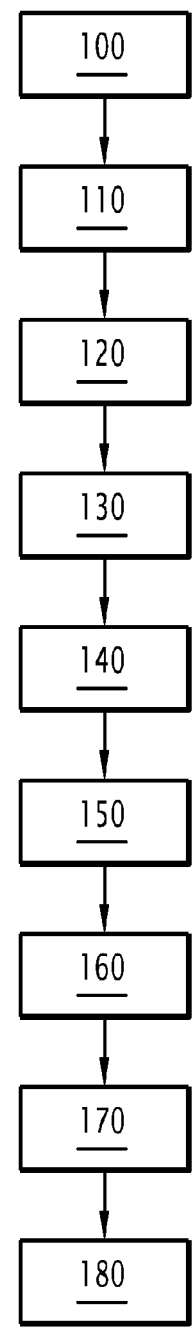

The invention will be explained in more detail hereafter, with reference to the drawings, wherein:

FIG. 1 is a bloc diagram of a wireless data emitting device according to an embodiment of the invention, FIGS. 2 and 3 are representations of data packets, illustrating the operation of a frame mapper of the wireless data emitting device of FIG. 1, and FIG. 4 is a bloc diagram representing the steps of a method for setting up an emitting device.

Functional elements of a wireless data emitting device 10 are illustrated on FIG. 1. Of course, several physical implementations may be designed, which achieve the functions of the functional elements illustrated on FIG. 1, without departing from the scope of the invention.

In the following description, data is organized in data packets. A data packet comprises a plurality of ordered elements, and will be represented as a vector. The length of a data packet designates the number of elements it contains.

The emitting device 10 is configured for receiving a flow of data constituted as a sequence of information packets $p_k = [p_1 \ldots p_K]$. The elements of the information packets are either bits or bytes. In the described example, each input data packet $p_k$ is a MPEG data packet.

The emitting device 10 is configured for generating, from the input data packets $p_k$, a waveform W that is provided to an antenna 12 for emitting the data.

The emitting device 10 comprises three stages 14, 16, 18, implemented in the physical layer of the OSI model, through which the flow of data passes.

1. Forward Error Correction

The first stage is a forward error correction (FEC) module 14, which outputs FEC data packets $X_j$.

More precisely, the FEC module 14 first comprises a concatenation module 19 configured for taking a number Nb of one or several information packets $p_k$, and regrouping them into a large data packet $P_j = [P_{1,j} \ldots P_{N,j}]$.

Considering one large data packet $P_j$, the FEC module 14 comprises a FEC coder 20 configured for generating a coded data packet $C_j = [C_{1,j} \ldots C_{M,j}]$, which contains the initial information plus redundant information. The rate of redundant information relative to the initial information data is referred to as the code rate. The FEC coder 20 uses for example the Turbo code.

The FEC module 14 further comprises a bit interleaver 22 configured to mix up the bits, of the extended data packet Cj. The bit interleaver 22 thus outputs an interleaved data packet $C'_j = [C'_{1,j} \ldots C'_{M,j}]$.

The FEC module 14 further comprises a constellation mapper 24. The constellation mapper 24 is configured for encoding the interleaved data packet $C'_j$ into a FEC data packet $X_j = [X_{1,j} \ldots X_{Lin,j}]$. A FEC data packet is a vector of constellation points of a chosen constellation diagram. The constellation points are usually represented by a complex number. The constellation diagram is for instance one of the QAM diagrams: QAM-4, QAM-16, QAM-64, QAM-256, etc. The constellation mapper 24 is able to encode each interleaved data packet with a different QAM constellation. The higher the constellation is, the more bits can be encoded in a single constellation point.

As it can be appreciated, the forward error correction module 14 is parameterized by three parameters, which each affects the quantity of data encoded in the $L_{in}$ constellation points. Those parameters are: the number Nb of input data packet $p_k$, the code rate, and the chosen constellation diagram.

In order to control the forward error correction module, the wireless data emitting device 10 comprises a controlling means 25 configured for setting parameters such that the forward error correction module 14 only outputs data packets comprising a fixed number $L_{in}$ of constellation points. In particular, the wireless data emitting device is able to set different FEC parameters for different data packets in a single frame, as it will be explained later.

Of course this same number $L_{in}$ is kept during normal operation of the emitting device. The fixed number $L_{in}$ may be changed by reconfiguring the controlling means 25. This is done for instance by the manufacturer.

2. Packet Interleaver

The second stage is a packet interleaver 16. The packet interleaver 16 is configured for selecting successive input sets of consecutive FEC data packets $(X_1 \ldots X_{Nin})$ received from the forward correction module 14. The functions of the packet interleaver 16 are for instance performed by a calculator configured accordingly.

For each set, supposing that this set comprises $N_{in}$ consecutive FEC data packets $X_1 \ldots X_{Nin}$, the packet interleaver 16 is configured for distributing their constellation points so as to form $N_{out}$ data packets $O_1 \ldots O_{Nout}$, which will be called symbols. As it will be explained later, a symbol $O_m$ comprises the constellation points that are intended to be emitted by the antenna 12 in a modulation symbol, for instance an OFDM symbol when using OFDM modulation.

The packet interleaver 16 is configured so that the number $N_{out}$ of formed symbols is related to the length $L_{in}$ of each FEC data packet by the relation: $L_{in} = A \times N_{out}$, where A is a fixed whole number (1, 2, 3, etc.).

With reference to FIGS. 2 and 3, the packet interleaver 16 is configured for segmenting each of the $N_{in}$ FEC data packets $X_j$ into $N_{out}$ fragments $G^j_1 \ldots G^j_{Nout}$ of a number A of consecutive constellation points. The packet interleaver 16 is further configured for forming each symbol ($O_m$) by, on the one end, choosing one fragment of constellation points in each of the $N_{in}$ data packets and, on the other end, aggregating the $N_{in}$ chosen fragments ($G^1_m \ldots G^{Nin}_m$) to form the symbol ($O_m$). The chosen fragments are different for each formed symbol ($O_m$).

In this way, the constellation points of each data packet is evenly distributed amongst a plurality of $N_{out}$ symbol $O_m$. If a symbol is lost when it is transmitted by the antenna 12, only a part of each input data packet is lost, and the lost data can be retrieved by using the redundant information of the input data packet contained in the other symbols.

Aggregating the $N_{in}$ chosen groups ($G^1_m \ldots G^{Nin}_m$) comprises mixing up the constellation points of each aggregated fragment with the constellation points of the other aggregated fragments, by alternating constellation points of each aggregated fragment, so as to interleave the aggregated fragments.

For instance, the constellation points in a symbol $O_m$ are organized into a number A (same A as before) of sequences of $N_{in}$ constellation points, where the j-th element of the sequence comes from the aggregated fragment of the j-th FEC data packet $X_j$.

Preferably, the packet interleaver 16 is configured for aggregating the chosen fragments in such a way that the constellation points a same data packet $X_j$ are positioned in the symbols $O_1 \ldots O_{Nout}$ at all the different possible positions. This is obtained in the described embodiment by shifting the position, in the symbols $O_1 \ldots O_{Nout1}$, of the constellation points coming from a same data packet $X_j$, by a constant shift step B between a symbol $O_m$ and the next symbol $O_{m+1}$.

The shifting is made circularly, that is, when the end of the symbol $O_m$ is attained, the remaining constellation point are placed at the start of the symbol $O_m$. Preferably, the shifting uses a constant shift step B.

In a preferred embodiment, the frame mapper (16) is configured for realizing the following operation:

$$O_{k,m} = X_{i,j}, i = 1 \ldots L_{in} \text{ and } j = 1 \ldots N_{in}$$

m being the ceil operation of i divided by A, $$k = \{((i-1)\%A) \times N_{in} + (j-1) + B \times (m-1)\}\%L_{out} + 1,$$

where:

$X_{i,j}$ is the i-th constellation point of the j-th FEC data packet ($X_j$), $O_{k,m}$ is the k-th constellation point of the m-th symbol ($O_m$), and $\ldots \% \ldots$ denotes the modulo division, i.e. $c = a \% b$, means that c is the remaining of a/b—therefore, c is a value from the set $\{0, 1, \ldots, a-1\}$.

For instance, m is calculated with the relation: $m = \lceil i/A \rceil$, where, $\lceil \ldots \rceil$ denotes the ceil operation, i.e. rounding to the nearest superior integer.

Alternatively, m is calculated with the relation: $m = \lfloor (i-1)/A \rfloor + 1$, where, $\lfloor \ldots \rfloor$ denotes the floor operation, i.e. rounding to the nearest inferior integer.

So as to insure that the groups of elements are shifted on exactly all the length $L_{out}$ of the symbols $O_1 \ldots O_{Nout}$, B is chosen so that B and $L_{out}$ are co prime (also called relative prime). Two numbers are called co prime if their Greatest Common Divider is one.

An example of using this relation is shown on FIGS. 2 and 3, with $N_{in}=2$, $L_{in}=8$, $N_{out}=4$, $L_{out}=4$ and $A=L_{in}/N_{out}=2$. In FIG. 2, B is set to zero (no shifting), while in FIG. 3, B is set to one.

3. Modulation

Referring back to FIG. 1, the modulator 18 further comprises a modulation unit 26 configured for receiving each symbol $O_m$ and for generating a modulated symbol $O'_m$, taking into account modulation parameters $\Delta$. The modulation parameters $\Delta$ are for example a number of pilots, a guard interval, etc.

The modulator 18 further comprises a waveform generator 28, which generates a waveform from the modulated symbols $O'_m$. More precisely, each constellation point of the symbol $O'_m$ modulates a respective carrier during a time $T_{symbol}$.

4. Setting Up

Referring to FIG. 4, a method for setting up an emitting device, in order to obtain the wireless data emitting device of FIG. 1, will now be explained. It would be appreciated that the order of the following steps can be different, without departing from the scope of the present invention, in particular for the steps that do not depend on the completion of a previous step.

In a step 100, a time frame $T_{frame}$, i.e. the duration of a frame, is chosen. Preferably, the time frame is chosen between 100 and 200 milliseconds.

In a step 110, a symbol duration $T_{symbol}$, i.e. the time during which the antenna 12 sends a symbol $O'_m$ before sending the next one $O'_{m+1}$, is chosen. $T_{symbol}$ is chosen so that there is a whole number of symbol durations in a frame duration $T_{frame}$. Preferably, $T_{symbol}$ is chosen between 100 microseconds and 4 milliseconds.

The number of symbols $O'_m$ that are sent in a frame is also deduced. It will be called in the following $N_{symbols/frame}$. From what precedes, one can see that there is a number $N_{symbols/frame}$ of modulated symbol $O'_m$ in a frame. Similarly, there is a number $N_{symbols/frame}$ of symbol $O_m$ in a frame.

In a step 120, the length $L_{max}$ of the modulated symbols $O'_m$ is determined as a function of the symbol duration $T_{symbol}$ and the available bandwidth. More precisely, $L_{max}$ is the product of $T_{symbol}$ with the available bandwidth. Basically, it may be considered that the length $L_{max}$ is related to the maximum number of available frequency carriers.

In a step 130, the modulation parameters $\Delta$ are chosen.

In a step 140, the length $L_{out}$ of the symbols $O_m$ is determined as a function of the length $L_{max}$ of the modulated symbols $O'_m$ and the modulation parameters $\Delta$. In fact, the modulation parameters $\Delta$ leads to some frequency carriers being not available for transmitting data, because they are used for obtaining a robust transmission (for example, they are used for pilot carriers). This leads to $L_{out}$ being smaller than $L_{max}$.

In a step 150, the number $L_{in}$ of constellation points in the FEC packets is set, by configuring accordingly the controlling means.

For each frame, the forward error correction module 14 generates $N_{FEC\ packets/frame}$ FEC data packets, whose data is to be emitted in the waveform W during the duration of the frame. Since there is no added information in the packet interleaver 16, $N_{FEC\ packets/frame}$ is derived, in a step 160, from the relation: $N_{FEC\ packets/frame} = N_{symbols/frame} \times L_{out}/L_{in}$.

From the previous relation, it can be seen that the FEC parameters (influencing $L_{in}$) and the modulation parameters $\Delta$ (influencing $N_{out}$) must be chosen such that $N_{symbols/frame} \times L_{out}/L_{in}$ is a whole number.

In a step 170, it is chosen a whole number P, which represents the portion of the $N_{FEC\ packets/frame}$ FEC packets of a frame that will be interleaved at a time by the packet interleaver 16.

Accordingly, $N_{in}$ is chosen so that $N_{in} = N_{FEC\ packets/frame}/P$, where P is a divisor of $N_{FEC\ packets/frame}$, and also of $N_{symbols/frame}$, so that $N_{out} = N_{symbols/frame}/P$.

When P=1, the whole frame is interleaved. On the contrary, when P is greater than 1, only a part of the frame is interleaved at a time. This is advantageous for decreasing the size of the memory needed in a receptor, for performing a "de-interleaving" operation, i.e. the inverse operation of the packet interleaver 16.

It can be appreciated that it is possible to send different services, requiring a different quality of service and thus different modulation parameters, in a single frame.

In fact, when the modulation parameters are changed, $L_{out}$ changes (cf. step 140), as well as $N_{FEC\ packets/frame}$ (cf. step 160). However, because of the relation $L_{in} = A \times N_{out}$, the packet interleaver 16 will still give an optimal distribution of the $N_{in}$ FEC packet between the $N_{out}$ data symbols.

Moreover, because of the previous relation ($L_{in} = A \times N_{out}$) and because $L_{in}$ is fixed for every FEC data packet, the emitting device 10 always generates the same number $N_{symbols/frame} = N_{out} \times P$ of symbols in a frame. A receiver is then able to demodulate efficiently received symbols. In fact, the receiver stays synchronized, because the number of symbols in a frame $N_{symbols/frame}$ remains constant. Once again, the receiver will not be affected by the fact that several different services are transmitted in a single frame.

From the previous description, it can be seen that the wireless data emitting device 10 comprises:
- a forward error correction module 14 configured for generating input packets $X_j$ from information packets, each input packet $X_j$ comprising $L_{in}$ constellation points of a predetermined constellation diagram, the $L_{in}$ constellation points encoding a quantity of data, the forward error correction module 14 being parameterized by at least two parameters, which each affects the quantity of data encoded in the $L_{in}$ constellation points,
- a controlling means 25 configured for setting the parameters of the forward error correction module 14,
- a packet interleaver 16 configured for generating $N_{out}$ output packets $O_1 \ldots O_{Nout}$ from $N_{in}$ input packets $X_1 \ldots X_{Nin}$, each output packet comprising $L_{out}$ constellation points, the packet interleaver 16 being configured for distributing the constellation points of each of the $N_{in}$ packet $X_j$ between the $N_{out}$ symbols $O_1 \ldots O_{Nout}$,
- a modulator 18 configured for generating a waveform W, destined to be provided to an antenna 12, from the symbols $O_m$, the controlling means 25 being configured for setting first parameters for the forward error correction module 14 to generate a first output packet, and second parameters, which are different from the first parameters, for the forward error correction module 14 to generate a second output packet, the first and second parameters being such that the first and second output packets both comprise a same number $L_{in}$ of constellation points.

In particular, the controlling means 25 is configured for setting parameters such that the forward error correction module 14 only outputs packets comprising the number $L_{in}$ of constellation points.

The invention claimed is:

1. A packet interleaving method comprising:
a calculator device selecting successive input sets of consecutive input packets ($X_1 \ldots X_{Nin}$) received from a forward correction module, each input packet ($X_j$) being a vector of constellation points of a predetermined constellation diagram, the consecutive input packet being FEC data packets from an FEC decoder, wherein
the packet interleaving method comprising the calculator device, for each input set:
generating an output set of output packets ($O_1 \ldots O_{Nout}$), each output packet ($O_m$) being a vector of constellation points, by distributing the constellation points of each input packet ($X_j$) of the input set between the output packets ($O_1 \ldots O_{Nout}$) of the output set,
sending the output packets ($O_1 \ldots O_{Nout}$) of the output set to a modulator configured for generating, from the output packets ($O_1 \ldots O_{Nout}$) a waveform (W), destined to be provided to an antenna, and
the input set comprising $N_{in}$ input packets ($X_1 \ldots X_{Nin}$) and each of the $N_{in}$ input packets ($X_1 \ldots X_{Nin}$) comprising a same number $L_{in}$ of constellation points, the number $N_{out}$ of output packets in the output set is related to $L_{in}$ by the relation $L_{in} = A \times N_{out}$, where A is a fixed whole number.

2. The packet interleaving method of claim 1, comprising for each input set:
segmenting each of the $N_{in}$ input packets ($X_1 \ldots X_{Nin}$) of the input set into $N_{out}$ fragments ($G^j_1 \ldots G^j_{Nout}$) of A consecutive constellation points,
generating each output packets ($O_m$) of the output set, by:
choosing one fragment of constellation points in each of the $N_{in}$ input packets ($X_1 \ldots X_{Nin}$),
aggregating the chosen fragments ($G^1_m \ldots G^{Nin}_m$) to form the output packet ($O_m$),
wherein the chosen fragments are different for each formed output packet ($O_m$).

3. The packet interleaving method of claim 2, comprising, in each output packet ($O_m$), aggregating the chosen fragments ($G^1_m \ldots G^{Nin}_m$) comprises mixing up the constellation points of each aggregated fragment with the constellation points of the other aggregated fragments.

4. The packet interleaving method of claim 3, wherein the mixing up of the constellation points in an output packet ($O_m$) comprises alternating constellation points of each aggregated fragment, so as to interleave the aggregated fragments.

5. The packet interleaving method of claim 2, comprising aggregating the chosen fragments in such a way that the constellation points a same packet ($X_j$), are positioned in the output packets ($O_1 \ldots O_{Nout}$) at all the different possible positions.

6. The packet interleaving method of claim 5, wherein positioning at all the different possible positions comprises shifting the position, in the output packets ($O_1 \ldots O_{Nout}$), of the constellation points coming from a same packet ($X_j$), by a constant shift step B between a symbol ($O_m$) and the next symbol ($O_{m+1}$).

7. The packet interleaving method of claim 1, comprising realizing the following operation:

$$O_{k,m} = X_{i,j}, i=1\ldots L_{in} \text{ and } j=1\ldots N_{in}$$

m being the ceil operation of i divided by A, $$k = \{((i-1)\%A) \times N_{in} + (j-1) + B \times (m-1)\}\%L_{out} + 1,$$

where:

$X_{i,j}$ is the i-th constellation point of the j-th packet ($X_j$), $O_{k,m}$ is the k-th constellation point of the m-th symbol ($O_m$), and ...%... denotes the modulo division.

8. The packet interleaving method of claim 1, wherein the time being divided into frames of constant duration, for each frame the forward error correction module generating $N_{FEC\, packets/frame}$ input packets, whose is to be emitted in the waveform (W) during the duration of the frame:

selecting successive input sets comprises the $N_{FEC}$ packets/frame input packets.

9. The packet interleaving method of claim 1, wherein the time being divided into frames of constant duration, for each frame the forward error correction module generating $N_{FEC\, packets/frame}$ input packets, whose is to be emitted in the waveform (W) during the duration of the frame:

selecting successive input sets comprises selecting a whole number P, greater than one, of consecutive sets of $N_{in}$ input packets ($X_1\ldots X_{Nin}$) of the $N_{FEC\, packets/frame}$ input packets, where $N_{in}$ is a whole number verifying $N_{in} = N_{FEC\, packets/frame}/P$.

10. A non-transitory machine readable storage medium containing thereon a computer program product directly loadable into the internal memory of a digital computer, comprising software code portions for performing the steps of claim 1 when said product is run on a computer.

11. A wireless emitting device, comprising:

a calculator device configured to execute selecting successive input sets of consecutive input packets ($X_1\ldots X_{Nin}$) received from a forward correction module, each input packet ($X_j$) being a vector of constellation points of a predetermined constellation diagram, the consecutive input packet being FEC data packets from an FEC decoder, wherein for each input set the calculator device performs the steps of generating an output set of output packets ($O_1\ldots O_{Nout}$), each output packet ($O_m$) being a vector of constellation points, by distributing the constellation points of each input packet ($X_j$) of the input set between the output packets ($O_1\ldots O_{Nout}$) of the output set, sending the output packets ($O_1\ldots O_{Nout}$) of the output set to a modulator configured for generating, from the output packets ($O_1\ldots O_{Nout}$), a waveform (W), destined to be provided to an antenna, and the input set comprising $N_{in}$ input packets ($X_1\ldots X_{Nin}$) and each of the $N_{in}$ input packets ($X_1\ldots X_{Nin}$) comprising a same number $L_{in}$ of constellation points, the number $N_{out}$ of output packets in the output set is related to $L_{in}$ by the relation $L_{in} = A \times N_{out}$, where A is a fixed whole number.

* * * * *

UNITED STATES PATENT AND TRADEMARK OFFICE
CERTIFICATE OF CORRECTION

PATENT NO. : 8,458,535 B2  
APPLICATION NO. : 12/602907  
DATED : June 4, 2013  
INVENTOR(S) : Hamman et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 642 days.

Signed and Sealed this
Eighth Day of September, 2015

Michelle K. Lee
*Director of the United States Patent and Trademark Office*